United States Patent [19]

Griffith et al.

[11] Patent Number: 5,018,074
[45] Date of Patent: May 21, 1991

[54] METHOD OF MAKING GATE ARRAY MASKS

[75] Inventors: J. Stephen Griffith; Patricia L. Roberts, both of Colorado Springs, Colo.

[73] Assignee: United Technologies Corporation, Hartford, Conn.

[21] Appl. No.: 267,198

[22] Filed: Nov. 4, 1988

[51] Int. Cl.⁵ .............................. G06F 15/60
[52] U.S. Cl. .................... 364/490; 364/489; 364/488
[58] Field of Search ............... 364/480, 489, 490, 491

[56] References Cited

U.S. PATENT DOCUMENTS

| | | | |
|---|---|---|---|
| T938,005 | 9/1975 | Colton et al. | 364/490 |
| 4,441,207 | 4/1984 | Lougheed et al. | 364/490 |
| 4,803,636 | 2/1989 | Nishiyama et al. | 364/491 |
| 4,882,690 | 11/1989 | Shinsha et al. | 364/489 |

OTHER PUBLICATIONS

"A Dense Gate Matrix Layout Method for MOS ILSI", by A. D. Lopez et al., IEEE Trans. Electron Devices, vol. ED-27, pp. 1671-1675, Aug. 1980.

Primary Examiner—Parshotam S. Lall
Assistant Examiner—V. N. Trans

[57] ABSTRACT

A method for making gate array masks in which a mask set for an existing set of gate array cells are converted to follow new design rules requiring a non-uniform transformation of circuit components is carried out by manually converting a defining set of circuit components from a first set of grid points to a second set, the second set being specified by the new design rules, and thereafter automatically converting grid points in the remaining gate array cells to the new system.

2 Claims, 2 Drawing Sheets

METHOD OF MAKING GATE ARRAY MASKS

TECHNICAL FIELD

The field of the invention is that of integrated circuit gate array layouts, in particular, layouts that involve a nonuniform shrink.

BACKGROUND ART

It is conventional in integrated circuit processing that the fabrication processes are continually being improved to reduce the geometry sizes, enhance device properties and lower production costs. There are many changes that cannot be made to all components of the circuit, so that a uniform size change for all components, referred to as a uniform shrink, does not give an optimum size reduction. In that case, each circuit must be changed by hand, which is extremely expensive and takes a long time. It is not possible, therefore, to implement improvements when they become available. It is necessary to wait until the benefit from making a change outweighs the costs of making it.

The conventional way of making a nonuniform shrink is the use of a "symbolic layout", in which schematic symbols representing components of the devices, such as the implant area for a transistor, the gate electrode, the vias, etc., are associated with a geometric size or shape, so that it is possible to convert from the pictorial representation of the layout to the coordinate numbers used to drive the automatic machinery that makes a mask.

In conventional practice, each cell of a set of logic cells for a gate array is converted individually and "by hand", either on paper or on a CAD system. A set of reference points, referred to as grid points, is defined for each cell, covering each mask element (each individual area that is defined on a mask) in the cell. The old circuit design is changed according to the new design rules and each mask element of the logic cell is adjusted in position. This process is repeated manually for each cell in the cell library. Errors are made in the conversion process, of course, and time is required to locate and correct the errors.

The industry has felt the need to make a nonuniform shrink in as automated a fashion as possible, not only to increase the speed of the transformation, but also to eliminate human errors in the conversion process.

This invention takes advantage of the fact that for gate array cells (as opposed to "custom" circuits or random logic), the mask/layout geometries differ only on the interconnect or "personalization" layers and the metal interconnect (contacts and vias) layers. All other layers, for example, field implant, diffusion and polysilicon are the same for every gate array cell. This means that any changes that must be made to these other layers affect all cells in the same way.

The invention also takes advantage of the fact that certain parameters, such as metal width or polysilicon width, are the same for all cells. These parameters may be represented "symbolically". This is a common simplification and when used, it is known as "symbolic layout".

DISCLOSURE OF INVENTION

The invention relates to an improved method of altering the layout of an existing and tested set of gate array logic cells to make a nonuniform transformation that affects some components of each logic cell but not all.

According to the invention, a cell, preferably the "most complex" cell (that with the most mask elements), in the cell library has its mask elements converted manually from the locations specified by the old set of design rules to the relative positions and locations specified by the new set of design rules, using a grid that spans the most complex cell. This change in position defines a coordinate transformation of the grid reference points used in the symbolic layout process and also of the dimensions of the actual mask elements. This nonlinear transformation is then applied to all other cells in the library by means of an automatic conversion process.

An optional feature of the invention is that a set of elements sufficient to specify all transformations (referred to as a "defining set") is used instead of the most complex cell and converted manually with the rest of the most complex cell converted automatically.

Other features and advantages will be apparent from the specification and claims and from the accompanying drawings which illustrate an embodiment of the invention.

BEST MODE FOR CARRYING OUT THE INVENTION

Figure 1A:
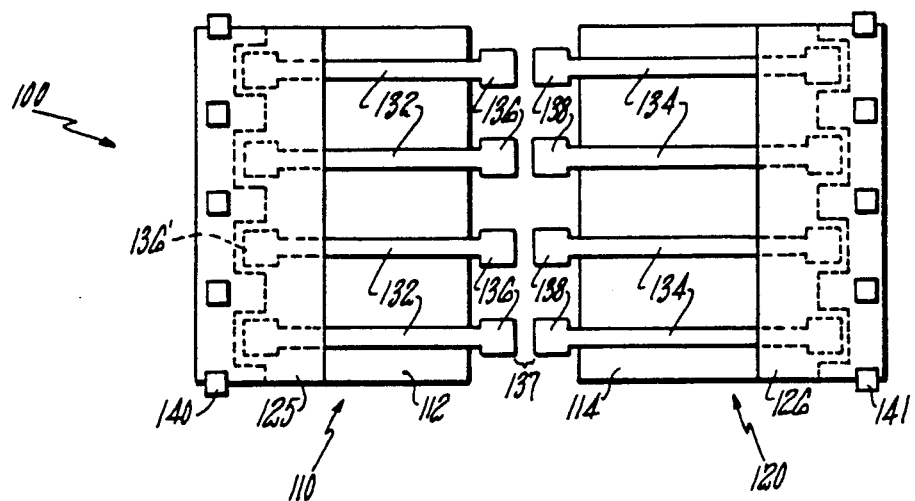
FIGS. 1A and 1B illustrate a gate array column structure and the associated grid points.

Referring now to FIG. 1A, there is shown a drawing of masks used in a gate array column structure that has been used in a conversion process according to the invention.

The overall structure, referred to generally by the numeral 100, comprises two columns 110 and 120, each column consisting of an active area 112 and 114 and a set of gate electrodes 132 and 134 which constitute a column of gates. The terminology is that the word gate refers to a logic gate and the word gate electrode refers to the actual gate electrode of an MOS transistor. In this illustrative example, the circuit is a CMOS circuit having PMOS and NMOS gates that are used together. The left column is the NMOS column in this example. The technology of the CMOS process is well known and does not form part of this invention.

Figure 1B:
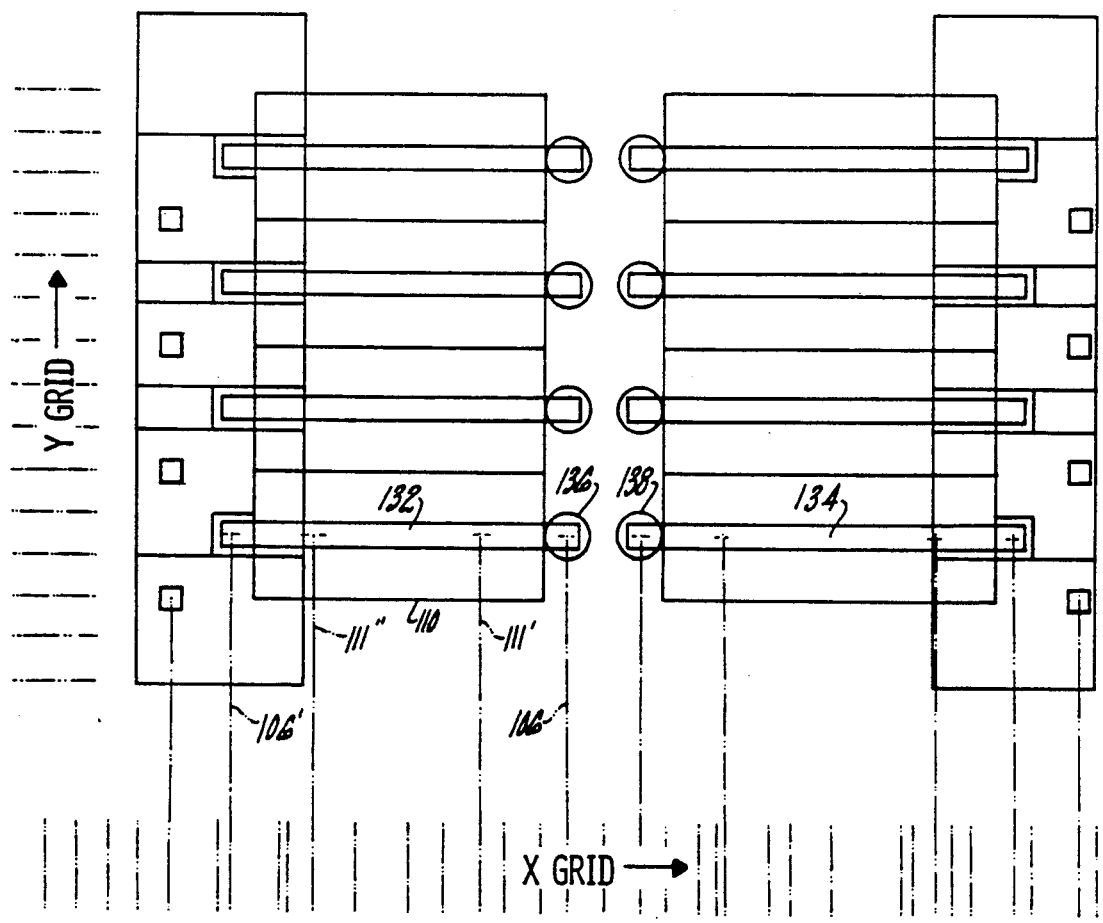

In this Figure, there are enlarged areas 136 and 138 on the ends of the gate electrodes 132 and 134 that are used to make contact with connecting wires or with vias extending to upper levels. A space referred to by the bracket 137 is defined between adjacent contacts. Buses referred to by the numerals 125 and 126 extend on an upper leVel above the column. Contacts 140 and 141 extend down from the bus or from other wires or connection in the upper level (metal) to lower levels (polysilicon gate electrodes or sources and drains in the active region). The relative spacing between these elements is specified by a set of design rules, as is conventional practice The corresponding column structure is illustrated in FIG. 1B in "symbolically digitized" form, in which the elements are indicated by simplified shapes. A conventional computer program will convert automatically from the coordinate specifications of the symbols used in the drawing to the actual geometric shapes and levels/layers that are used in the masks. The term "mask element" will be used to refer to an aperture or a defining element in an integrated circuit mask. A mask element may be the pattern of a gate electrode, a contact, a bus or any other circuit element or individual component that goes to make a circuit element. A mask element may be represented by a symbol with a single grid point, as in the case of an aperture for a via, or may require a symbol with more than one grid point, as in the case of the path for a metal wire. One symbol may also represent mask elements on more than one level, as is the case for apertures that pass through two or more layers.

In FIG. 1B there is a set of marks referred to as the X grid and the Y grid which specify reference points for critical dimensions of the mask elements. The position of these marks is specified in terms of a conventional Cartesian coordinate system. The grid points, as can be seen, do not have a uniform spacing. Some examples in FIG. 1B are points 106 and 106' which refer to the X coordinates of the ends of the gates 136 and 136' respectively and points 111' and 111", which refer to the endpoints of the symbols/rectangle used to represent diffusion on diffusion area of the column.

It may be noted that the X grid is nonuniform and is nonlinear in spacing, while the Y grid is uniform. This is conventional for gate arrays and may be altered if desired. In conventional gate layout practice, the acceptable points for the active column, the positions of gate electrodes, the positions of vias or contact points between upper and lower levels and the permissible locations of connecting wires are all referred to in terms of grid points.

As was mentioned above, when an improved process (such as, for example, an improved poly deposit process that decreases space 137 in FIG. 1A) is implemented, then corresponding design rules may be changed. This particular improvement will not affect the permitted spacing between wires or vias, so that it is not possible to implement this change by a uniform shrink or grow. In the prior art, it has been necessary to convert each cell of a library by hand, with a grid being defined for each cell and the elements in that cell being readjusted in accordance with the new design rules.

Figure 2:
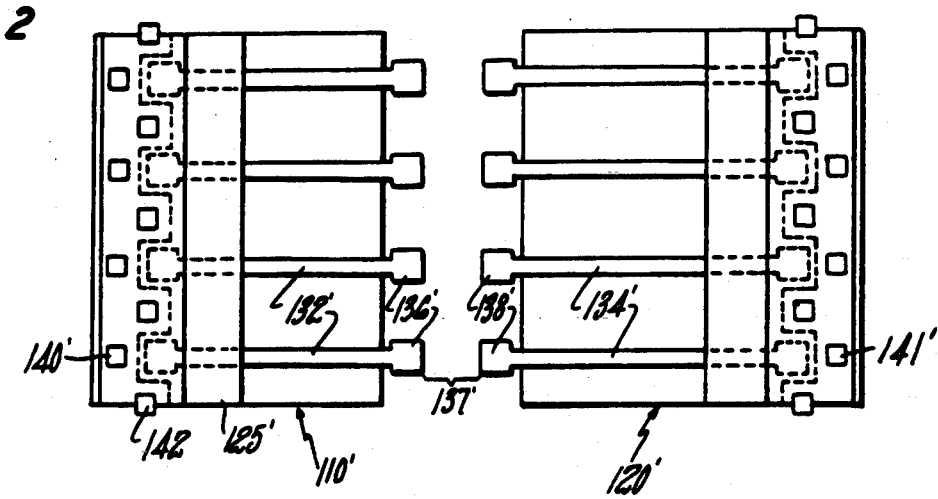
FIG. 2 illustrates the column structure shown in FIG. 1A redesigned using new design rules.

A new column structure that has been used as the basis for a new set of library cells converted according to the invention is illustrated in FIG. 2, in which corresponding points are indicated by corresponding numbers. It may be noted, in particular, that the spacing 137' between adjacent gate electrodes has increased (which permits the location of a via contact there) and that the overlap of bus 125' on the active column is greater than for the previous bus 125. This change means that the conversion cannot be implemented by a uniform change, since the length of the gate electrodes and the Y spacing has not changed.

According to the method, the tallest cell in the old library is selected and a grid is defined extending over the entire range of the cell, using as many grid points and whatever inter-point spacing is required. All the critical points of the mask elements in this cell are then defined in terms of the Cartesian coordinate system setting up a grid system for this cell. The remaining cells for the library are then specified in terms of the same grid system; i.e., the starting and stopping position of all gate electrodes in all cells are specified by the same two grid points; the permissible location for vias in all cells are specified by the same set of via grid points, etc. This use of a universal, nonuniform grid has not been the practice in the prior art of gate array manufacture, in which the practice has been to specify a uniform grid spacing loosely packed enough, meaning that the spacing between circuit components was made large enough to accommodate all design rules.

The elements within the most complex cell are changed in location and size according to the new set of design rules. In the illustrative example, dimension 137' and the width of bus 125 are altered. It will be evident that it is only necessary to specify dimension 137' once, since it is constant for all pairs of gates in the cell. Similarly, there are only two buses over the cell and they need to be specified only once.

This introduces the concept of the "defining set" which means a sufficient number of mask elements or grid points in the cell to define the positions of other corresponding mask elements in the cell. It is not necessary to convert the location of all mask elements in the cell by hand if conversion of one element defines the new position of a group of similar elements. In this case, the defining set would be the dimensions of the active areas, the gate electrodes, the contact positions, the via positions, the permissible locations of interconnecting wires and the location of the circuit buses. The remainder of the most complex cell in excess of the defining set may be converted by hand or by use of a computer program, as preferred. It is not necessary to use the most complex cell to define the conversion process if a smaller cell will produce a defining set. If the only difference between cells are in the Y direction, which has uniform spacing, any of a number of cells may do, since the grid may be extended indefinitely in the Y direction. In a rare case, the most complex cell may not produce a defining set. If so, then the defining set may be generated by using as many extra cells as required.

Figure 3:
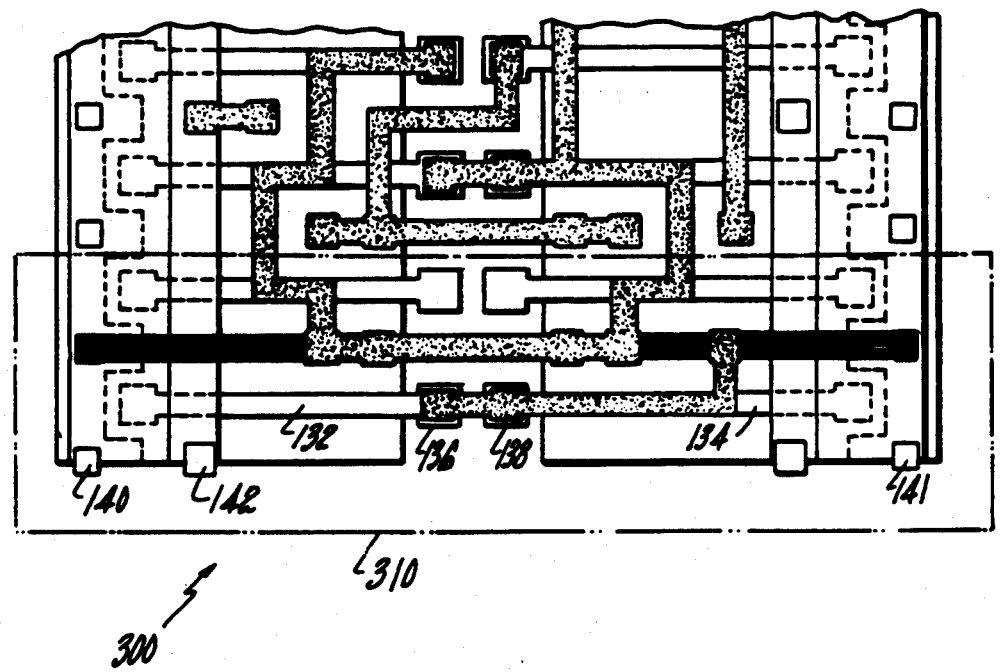
FIG. 3 illustrates a complex gate array cell/circuit layout.

FIG. 3 shows a portion of a plot of the mask elements of a gate array cell including a defining set indicated by the dotted line labelled 310. Elements referred to in FIG. 1 are indicated by the same numbers. The actual pattern of the metal interconnections are not relevant to the defining set, but the coordinates of the permitted paths that may be used by a metallization pattern are part of the defining set.

With the new coordinate positions of the defining set of the most complex cell specified, there has been fully defined a coordinate transformation that will be a nonlinear transformation between the Cartesian coordinates of the grid positions in the first library and the corresponding Cartesian coordinates of corresponding grid positions in the second library. This conversion may be implemented by a simple look-up table in a computer or by a mathematical algorithm, as is convenient. The remainder of the cells may be converted by running their specifying parameters through a conversion program to implement this transformation, thus eliminating human error that will inevitably arise in transforming a set of cells.

FIGS. 1A and 1B have illustrated two ways of pictorially representing the circuit. There is also a "digital representation" which is a set of numbers (a vector) that specifies the type of element and the associated grid point or points (i.e., the gate electrode mask element has grid points 1,1 and 1,5 associated with it). The mask element may be specified either with reference to the grid points or with reference to the Cartesian coordinates of the grid points. All three of these are representations of the same cell.

The digital representation, of course, is the one most suitable for input into the conventional program which drives an electron beam machine to generate a mask to actually form the integrated circuit.

In a preferred embodiment of the method, the conversion is done for all cells in a library by means of a digital computer conversion program and the results are stored as the defining positions of the mask elements of the individual cell in a conventional format such as the CIF (Caltech Intermediate Format), or the MANN 3600 format, that is used as input to the mask-generating system that generates the art work to form a particular mask.

In actual manufacturing practice, of course, a gate array consists of a number of cells from the cell library together with interconnections. The mask for such a gate array circuit is assembled, by means of other computer programs, from the stored data representing the masks of the individual cells. This process of assembling the individual cell data to form a composite mask is conventional. An example is the Highland system supplied by United Technologies Microelectronics Center.

In order to clarify the terminology, in this application, the term "mask cell subset" will refer to those elements of a mask that are used in the nth level mask for a cell. In the mask of a circuit, there will be one mask cell subset for each cell included in the circuit. The mask elements are those components that appear on a mask—implant apertures, apertures defining transistor gates, apertures defining wires, vias, contacts, etc. The circuit elements are transistors, resistors, capacitors and wires that are formed from a set of mask elements by the conventional integrated circuit process.

The automatic conversion process may be carried out in any convenient computer, preferably a digital computer. No particular form of program is preferred, a simple look-up table being sufficient.

The sequence of the conversion process may be altered as is convenient. Preferably, the program may be run once and the new set of mask-defining data for each cell will be stored in the conventional format ready for assembly to form the total mask of a circuit. The process of specifying new grid points consistent with the new design rules may be carried out with pencil and paper or on a CAD system, as is convenient.

The invention has been used to convert a set of more than 100 3-micron gate array cells to both a 2-micron and 1.2 micron set in less than one man-month, instead of the approximately twelve man-months that would have been required by conventional methods.

It should be understood that the invention is not limited to the particular embodiments shown and described herein, but that various changes and modifications may be made without departing from the spirit and scope of this novel concept as defined by the following claims.

I claim:

1. A method of making a derivative set of masks for a set of integrated circuit gate array logic cells based on a column structure of gates, from a first set of masks containing a set of mask elements having predetermined characteristic dimensions and predetermined associated grid points, following a first set of design rules, comprising the steps of:

specifying grid points and corresponding dimensions, in a first coordinate system, of a defining set of mask elements of said set of integrated circuit gate array logic cells, including said column structure, in accordance with said first set of design rules, whereby a digital representation of said defining set of mask elements is established that includes at least one grid point in said first grid system for each member of said defining set, said dimensions and location of all components of said defining set in said first coordinate system being stored in predetermined association with said at least one grid point;

specifying corresponding reference points of all components in all cells of said set of integrated circuit gate array logic cells in terms of said first grid system, thereby establishing a first digital representation of said set of logic cells in which each component of said set of logic cells is represented by a reference grid position in said first grid system;

storing said first digital representation of said symbolic representation in a storage medium;

altering dimensions and grid positions in said coordinate system of said mask elements of said defining set in accordance with said second set of design rules, thereby defining a second grid system ranging over said defining set, whereby a nonlinear coordinate transformation is established between grid points of said defining set in said first grid system and corresponding grid points in said second grid system, and;

in an automatic data processing system, stepping through said first digital representation of at least one other cell in said set of logic cells and transforming grid points of at least one component of said at least one other cell according to said defined transformation, whereby said at least one component of said at least one other logic cell is characterized by a second digital representation related to said second grid system and in accordance with said second set of design rules.

2. A method according to claim 1, further including the step of plotting, under stored program control, a predetermined mask cell subset of mask elements for each of at least one logic cell of said set of logic cells, thereby forming a representation of one mask of a set of integrated circuit masks.

* * * * *